United States Patent
Reynolds et al.

(10) Patent No.: US 8,253,425 B2
(45) Date of Patent: Aug. 28, 2012

(54) PRODUCTION TESTING OF A CAPACITIVE TOUCH SENSING DEVICE

(75) Inventors: Joseph K. Reynolds, Sunnyvale, CA (US); Pavan Kumar Ramarapu, Saratoga, CA (US)

(73) Assignee: Synaptics Incorporated, Santa Clara, CA (US)

( * ) Notice: Subject to any disclaimer, the term of this patent is extended or adjusted under 35 U.S.C. 154(b) by 1249 days.

(21) Appl. No.: 12/011,698

(22) Filed: Jan. 28, 2008

(65) Prior Publication Data

US 2008/0278453 A1 Nov. 13, 2008

Related U.S. Application Data

(60) Provisional application No. 60/928,462, filed on May 8, 2007.

(51) Int. Cl.
*G01R 27/26* (2006.01)

(52) U.S. Cl. .... 324/658; 324/686; 324/519; 324/750.17

(58) Field of Classification Search .................. 324/661, 324/662, 679, 686, 658, 678; 178/18.06, 178/19.03; 345/173, 174
See application file for complete search history.

(56) References Cited

U.S. PATENT DOCUMENTS

| | | | |
|---|---|---|---|
| 5,469,364 | A | 11/1995 | Hughey et al. |
| 6,583,676 | B2 | 6/2003 | Krah et al. |
| 6,600,325 | B2 | 7/2003 | Coates et al. |
| 2005/0218913 | A1 | 10/2005 | Inaba et al. |
| 2007/0222762 | A1* | 9/2007 | Van Delden et al. ......... 345/173 |
| 2008/0079444 | A1* | 4/2008 | Denison ........................ 324/679 |
| 2008/0157782 | A1 | 7/2008 | Krah |
| 2008/0158172 | A1 | 7/2008 | Hotelling et al. |
| 2008/0162996 | A1 | 7/2008 | Krah et al. |
| 2008/0297487 | A1 | 12/2008 | Hotelling et al. |

FOREIGN PATENT DOCUMENTS

| | | |
|---|---|---|
| CA | 2202789 | 6/2001 |
| EP | 0722091 | 3/2004 |
| EP | 1131641 | 9/2004 |
| EP | 0829014 | 1/2005 |
| WO | WO-2008/085418 | 7/2008 |
| WO | WO-2008/085720 | 7/2008 |

OTHER PUBLICATIONS

ISA/US, International Search Report and Written Opinion for International Application No. PCT/US2008063031, 8 pages, Sep. 12, 2008.

* cited by examiner

*Primary Examiner* — Jermele M Hollington
*Assistant Examiner* — Alesa Allgood

(57) ABSTRACT

In one embodiment, a method for production testing of a capacitive touch sensing device is disclosed. In this embodiment, the present technology for production testing of a capacitive touch sensing device samples a first value corresponding to a first channel of a capacitive touch sensing device when the capacitive touch sensing device is in production. The present embodiment also samples a second value corresponding to the first channel of the capacitive touch sensing device when the capacitive touch sensing device has a self-test capacitive circuit applying a signal thereto. The present embodiment compares the first value and the second value to determine a production testing result for the first channel of the capacitive touch sensing device, wherein the sampling of the second value and the comparing the first value and the second value occur during production of the capacitive touch sensing device.

25 Claims, 3 Drawing Sheets

PRODUCTION TESTING OF A CAPACITIVE TOUCH SENSING DEVICE

RELATED U.S. APPLICATION

This application claims priority to the copending provisional patent application Ser. No. 60/928,462, entitled "Production Testing of a Capacitive Sensing Device," with filing date May 8, 2007, assigned to the assignee of the present application, and hereby incorporated by reference in its entirety.

BACKGROUND

Capacitive touch sensing devices have found significant utility in a wide variety of applications and systems. For example, capacitive touch pads are commonly used in portable computers. Similarly, capacitive touch screens are encountered in automated teller machines (ATMs), airport check-in kiosks, and in virtually countless other implementations. Capacitive touch sensing devices are also proving beneficial in smaller devices such as, for example, portable music players, personal digital assistants (PDAs), and cellphones. As the utilization of, and corresponding demand for, capacitive touch sensing devices increases, the rate at which such capacitive touch sensing devices are manufactured must also increase.

In order to meet the demand for capacitive touch sensing devices, corresponding manufacturing processes must achieve considerable throughput. Additionally, such manufacturing processes must remain cost effective. Furthermore, to ensure customer satisfaction, it is imperative that the manufactured capacitive touch sensing devices operate in compliance with promised specifications and performance requirements.

One method to ensure that manufactured capacitive touch sensing devices meet corresponding performance requirements is to manually test each capacitive touch sensing device using a test bench or similar testing apparatus. Such an approach is time consuming, labor intensive, and unreasonably expensive. Hence, such an approach is not practical. While random or "spot-testing" of manufactured capacitive touch sensing devices may reduce the time, labor, and cost associated with testing of the manufactured capacitive touch sensing devices, it is still possible that capacitive touch sensing devices which do not meet promised specifications and performance requirements will be released to customers.

Hence, it would be advantageous to have a method for testing capacitive touch sensing devices wherein the method does not suffer from the drawbacks described above. It would further be advantageous to have a method for testing capacitive touch sensing devices wherein the method is able to ensure that capacitive touch sensing devices, which do not meet promised specifications and performance requirements, are not released to customers.

SUMMARY

In one embodiment, a method for production testing of a capacitive touch sensing device is disclosed. In this embodiment, the present technology for production testing of a capacitive touch sensing device samples a first value corresponding to a first channel of a capacitive touch sensing device when the capacitive touch sensing device is in production. The present embodiment also samples a second value corresponding to the first channel of the capacitive touch sensing device when the capacitive touch sensing device has a self-test capacitive circuit applying a signal thereto. The present embodiment compares the first value and the second value to determine a production testing result for the first channel of the capacitive touch sensing device, wherein the sampling of the second value and the comparing the first value and the second value occur during production of the capacitive touch sensing device.

The drawings referred to in this description should not be understood as being drawn to scale except if specifically noted.

DETAILED DESCRIPTION

Reference will now be made in detail to embodiments of the invention, examples of which are illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention. Furthermore, in the following detailed description of the present invention, numerous specific details are set forth in order to provide a thorough understanding of the present invention. However, the present invention may be practiced without these specific details. In other instances, well known methods, procedures, components, and circuits have not been described in detail as not to unnecessarily obscure aspects of the present invention.

Figure 1:
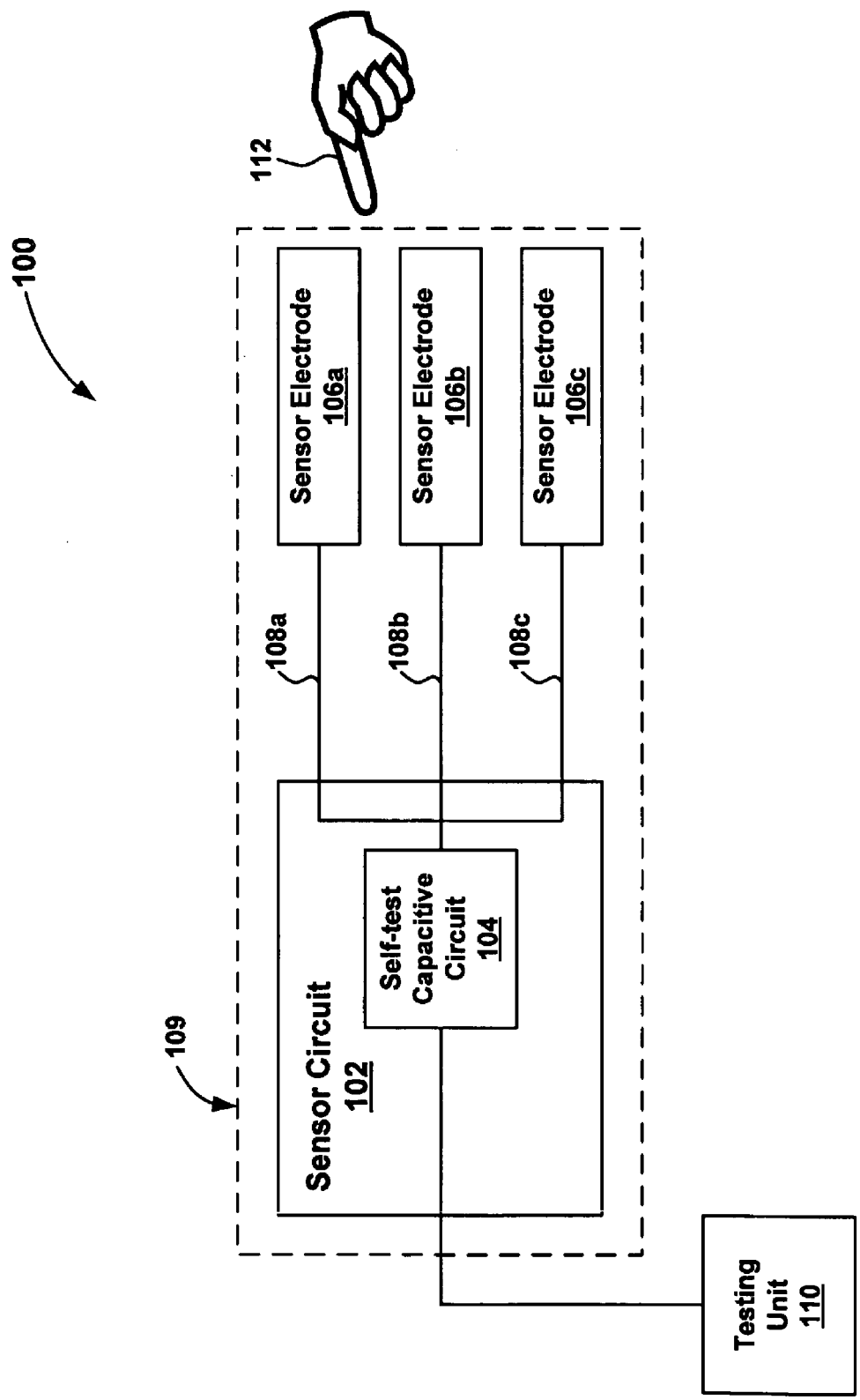
FIG. 1 is a schematic diagram of a production testing system coupled to a capacitive touch sensing device in accordance with embodiments of the present invention.

Referring now to FIG. 1, a schematic diagram of a production testing system coupled to a capacitive touch sensing device is shown. The following discussion will begin with a detailed description of the physical structure of embodiments in accordance with the present invention and will refer to FIG. 1 and to FIG. 2. This discussion will then be followed with a detailed description of the operation of embodiments in accordance with the present invention and will refer to flow chart 300 of FIG. 3. In the embodiment of FIG. 1, a sensor circuit 102 is shown containing a self-test capacitive circuit 104. In one embodiment, sensor circuit 102 is implemented in an application specific integrated circuit (ASIC) that is specifically designed and configured to operate in conjunction with (e.g. measure values received from) sensor electrodes of the capacitive touch sensing device. Self-test capacitive circuit 104 is described in detail below in conjunction with the description of FIG. 2.

In the embodiment of FIG. 1, sensor circuit 102 is coupled to three sensor electrodes, sensor electrode 106a, sensor electrode 106b, and sensor electrode 106c via trace 108a, trace 108b, and trace 108c, respectively. Although three sensor electrodes are shown in FIG. 1, embodiments in accordance with the present invention are also well suited to use with a capacitive touch sensing device comprised of a single sensor electrode, two sensor electrodes, or more than three sensor electrodes. Additionally, embodiments in accordance with the present invention are also well suited to use sensor electrodes having any of various shapes, sizes, or patterns. Also, it should be understood that in one embodiment in accordance with the present invention, the capacitive touch sensing device is defined by those elements contained within dotted box 109. More specifically, in embodiments in accordance with the present invention, testing unit 110 is physically separate from the capacitive touch sensing device. Furthermore, for purposes of the present discussion, it should be understood that in one embodiment in accordance with the present invention, the production testing system includes testing unit 110. FIG. 1 further includes an object 112 (e.g. a finger, a stylus, a pointing object, etc.) shown approaching sensor electrodes 106a, 106b, and 106c. It will be understood that as object 112 moves towards or away from capacitive touch sensing device 109, capacitive touch sensing device will observe a change in a measured capacitance value.

Referring still to FIG. 1, testing unit 110 is shown separated from capacitive touch sensing device 109. Embodiments in accordance with the present invention are also well suited to incorporating at least portions of self-test capacitive circuit 104 into testing unit 110. Similarly, embodiments in accordance with the present invention are also well suited to incorporating at least portions of testing unit 110 into self-test capacitive circuit 104.

Figure 2:
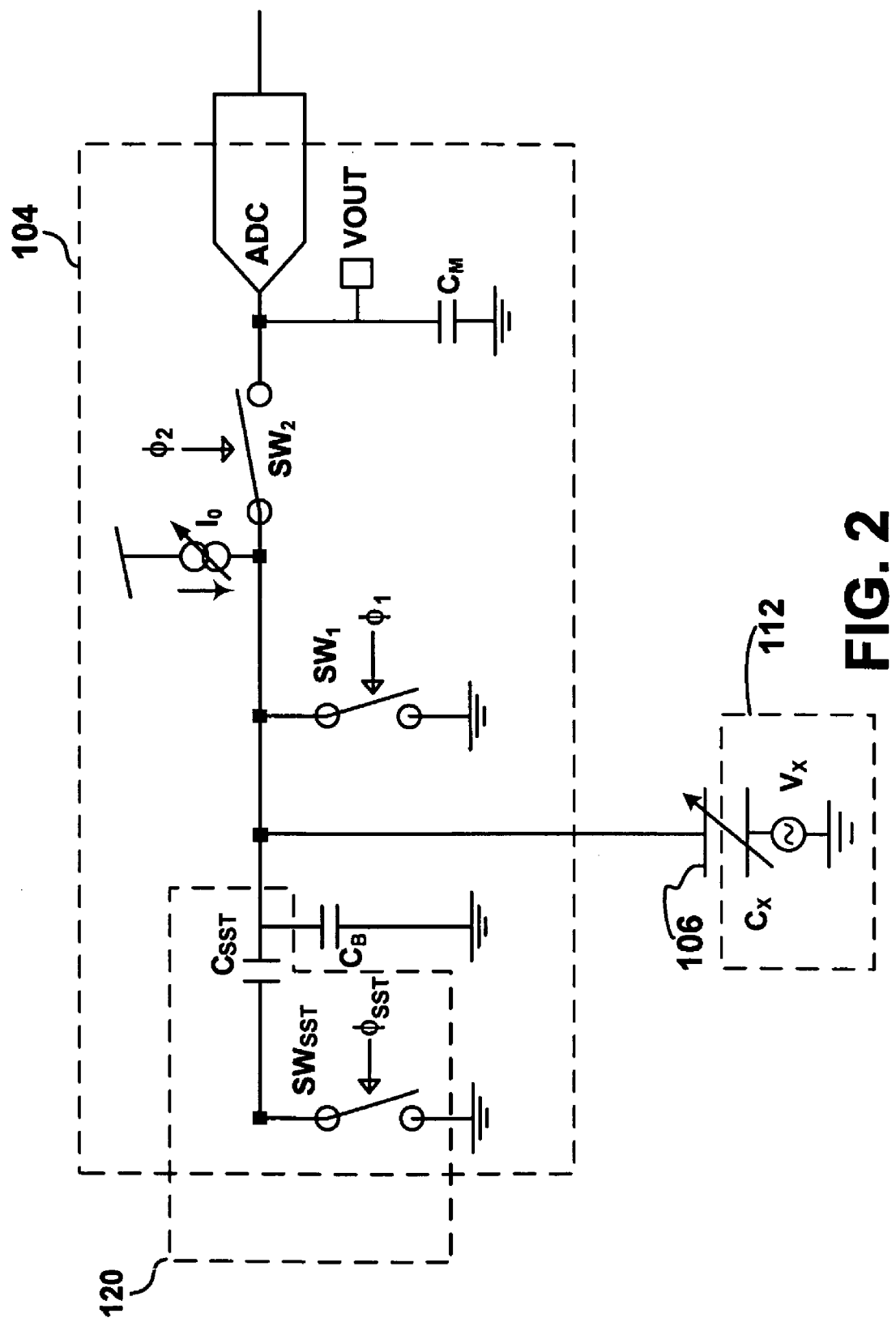
FIG. 2 is a detailed schematic circuit diagram of the self-test capacitive circuit of FIG. 1 in accordance with embodiments of the present invention.

Referring now to FIG. 2, a detailed schematic circuit diagram of self-test capacitive circuit 104 of FIG. 1 is shown. As will be described below, self-test circuit 104 is used to switch in and switch out a capacitance in parallel with a measured capacitance while the capacitive touch sensing device 109 is in production. The response of capacitive touch sensing device 109 to the periodically altered capacitive value is used to determine a production testing result for capacitive touch sensing device 109. Although a specific circuit diagram is depicted in FIG. 2, embodiments in accordance with the present invention are well suited to designing self-test capacitive circuit 104 using any combination of circuitry that enables the generation of a production testing result. In the embodiment of FIG. 2, a single self-test capacitive circuit 104 is shown which may be coupled to a plurality of sensor electrodes 106a, 106b, and 106c. Embodiments in accordance with the present invention are also well suited to having a plurality of self-test capacitive circuits contained within sensor circuit 102. In such an embodiment, it is possible that each sensor electrode will have a dedicated self-test capacitive circuit associated therewith, or that two or more sensor electrodes will share a common self-test capacitive circuit. The self-test capacitive circuit utilized in the present production method and system for testing capacitive touch sensing devices can be comprised of fewer or greater or even different elements as long as the circuit is able to perform the desired task of changing the measured value of the capacitive sensor by an amount corresponding to a known capacitance.

This capacitive signal causing the change may be applied to the sensor and measured in a variety of ways. In one embodiment the switch SWsst connects a floating capacitance Csst to a fixed voltage (using any additional required control electronics such as φsst) as shown in FIG. 2, but a variety of other implementations and topologies are possible. In an alternate embodiment a coupling switch may be placed between a test capacitance and the measurement circuit, or other impedances (e.g. resistances, networks of impedances, etc.) or active elements other than switches (e.g. current sources, buffers, etc.) could be used or added to a circuit to apply the signal to the sensor or guard the sensor from the capacitance. For example the self-test capacitance could be isolated by a resistance instead, such that its coupling would be dependent on excitation rate, or in yet another embodiment the capacitance could remain continuously connected, but a guarding or exciting waveform turned on and off to change the effective capacitive signal. These techniques are typically related to the particular choice of capacitive touch sensing method and sensing topology, and are well known to those versed in the art. Not all elements of the capacitive touch sensing circuit are shown in FIG. 2 since again a variety of methods are available. In one embodiment the voltage VOUT would be filtered, sampled, and digitized (e.g. by a an ADC and associated processing electronics) so that the comparison of sensor measurements could be made digitally. In another embodiment, the comparison may take place in the analog regime (e.g. the difference may be computed by subtracting charges from two samples), and only one sensor measurement of the samples need be made to produce the result.

Figure 3:
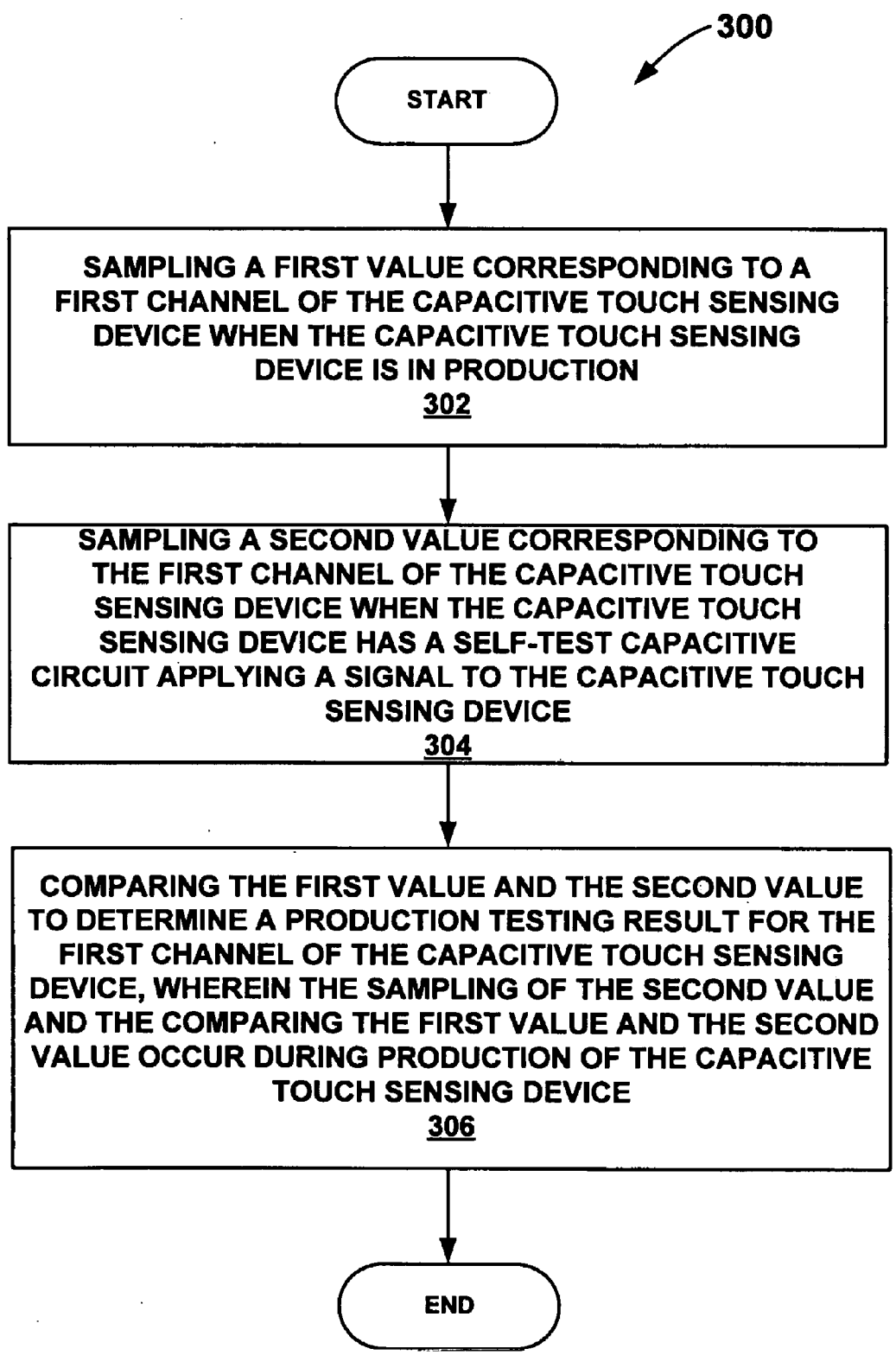
FIG. 3 is a flow chart describing a method for production testing of a capacitive touch sensing device in accordance with embodiments of the present invention.

Referring now to FIG. 3, a flow chart 300 of processes performed in accordance with the present method for production testing of a capacitive touch sensing device is shown. As an overview and as discussed above, capacitive touch sensing devices under production need to be tested to make sure they function properly before being shipped (e.g. to the end user). It should be noted that capacitive touch sensing devices may have a sensitivity that is inversely proportional to total measured capacitance. As a result, variations in the manufacturing or assembly of capacitance sensing devices can cause sensitivity variations. These sensitivity variations are particularly significant in capacitive touch sensing devices with thicker face sheets (e.g. dielectric coverings), particularly for capacitive buttons. Sensitivity variations are also of great concern in capacitive touch sensing devices which are configured for detecting hover proximity or which require uniform scrolling or pointing performance. Hence, such production testing is becoming increasingly important as capacitive touch sensing devices are used with thicker dielectric materials and/or in a smaller region (e.g. in a cellphone application). However, most conventional testing methods require a human operator to manually test each capacitive touch sensing device or randomly test selected capacitive touch sensing devices. Such conventional approaches are costly, may require the use of and alignment to a complex and expensive dedicated testing fixture, and such conventional approaches introduce unacceptable throughput delay into the manufacturing process. Often, these conventional approaches involve applying a known grounded plate (or a finger) to the capacitive testing device and looking for a proper response or sensitivity reading. As will be described below in detail, embodiments in accordance with the present invention automate the production testing process using self-test capacitive circuit 104 to simulate a grounded mass approaching or being sensed by capacitive touch sensing device 109. By using the present method, it is possible to efficiently perform production testing on every capacitive touch sensing device coming off of the assembly line in a timely manner. Furthermore, the present method for production testing of capacitive devices is able to detect defects introduced at the time of assembly (e.g. shorts from traces to a power supply, a shield, or to other sensing traces), which are not correctable during subsequent operation of the capacitive touch sensing device using conventional compensation techniques.

As will be described in detail below, the present method utilizes self-test circuit 104 of FIG. 1 in conjunction with testing unit 110 to run a test on a production capacitive touch sensing device 109. In one embodiment in accordance with the present invention, a production testing result obtained for the capacitive touch sensing device is used to determine the capacitive touch sensing device's characteristics, detect defects, and/or to make sensitivity adjustments to the capacitive touch sensing device while the capacitive touch sensing device is in production. Production testing should take place before final packaging and delivery to an end user, but may start even before assembly of the sensing module and it is appreciated that multiple production tests may take place at different times and places for a single device. Specifically, at 302, the present method samples a first value corresponding to a first channel of capacitive touch sensing device 109 when capacitive touch sensing device 109 is in production. More specifically, in one embodiment, sensor circuit 102 having self-test capacitive circuit 104 contained therein samples a value corresponding to a channel corresponding to sensor electrode 106a. As stated above, although a single self-test capacitive circuit 104 is shown coupled to a plurality of sensor electrodes 106a, 106b, and 106c, embodiments in accordance with the present invention are also well suited to having a plurality of self-test capacitive circuits contained within sensor circuit 102 for testing multiple channels simultaneously (as well as sequentially).

Referring still to 302 of FIG. 3, because self-test capacitive circuit 104 is integrated within sensor circuit 102, the present method eliminates the need for a separate, complex, and expensive dedicated testing fixture. It may also eliminate the need for additional area for test points or connections to the sensor and its associated electrodes. Additionally, in embodiments in accordance with the present invention, production testing of the capacitive touch sensing device can be launched by either an external device (e.g. testing unit 110) connected to the capacitive touch sensing device, or internally using a BIST (Built in Self-Test) as an ASIC function within either sensor circuit 102 or within self-test capacitive circuit 104. Furthermore, self-test capacitive touch sensing circuit 104 is well suited for use with most capacitive touch sensing schemes including, but not limited to, linearizing designs with inverse capacitance sensitivity, sigma delta sensing sensors, and scanned sensing systems where a reduced (e.g. a single one) number of electrode sensors are sampled simultaneously.

With reference now to 304 of FIG. 3, the present method for production testing of a capacitive touch sensing device samples a second value corresponding to the first channel of capacitive touch sensing device 109 when capacitive touch sensing device 109 has self-test capacitive circuit 104 applying a signal thereto. It should be noted that the present method for production testing of capacitive touch sensing device 109 is well suited to performing process 304 either prior or subsequent to performing process 302. Moreover, in embodiments in accordance with the present invention, the sampling of the second value occurs during production of the capacitive touch sensing device. In one embodiment, the present method for production testing of a capacitive touch sensing device switches in a known size capacitor and measures the response of the electrode sensor to this capacitance change. It should be noted that the change in capacitance could be to absolute single-ended capacitance or to double-ended trans-capacitance. In embodiments in accordance with the present method for production testing of a capacitive touch sensing device, applying a signal is not intended to be limited to applying an electrical (voltage/current) signal, but is instead also intended to include, but not be limited to applying a predetermined change in capacitance, or changing the sensitivity of the sensor by predetermined amount to a predetermined capacitance. The sensor output should then change by a predetermined value related to the predetermined capacitance. More specifically, in embodiments in accordance with the present invention, one or more capacitors (of known size) are typically isolated or connected to one or more electrode sensors at a time using a switch. To obtain the second value corresponding to the first channel of capacitive touch sensing device 109, in one embodiment a charge is transferred by the switch such that a capacitance change is observed by the electrode sensor. Alternately, to obtain the second value corresponding to the first channel of capacitive touch sensing device 109, in another embodiment the charge on a capacitance is increased by other means such that an apparent capacitance change is observed by the electrode sensor.

Referring still to step 304, the present method for production testing of a capacitive touch sensing device is also well suited to use with sensing systems that apply a voltage and/or a charge to determine the response of a capacitive touch sensing device. Furthermore, in embodiments in accordance with the present invention it is possible for testing unit 110 of FIG. 1 to control the operation of self-test capacitance circuit 104. Conversely, embodiments in accordance with the present invention are also well suited to having self-test capacitance circuit 104 control its own operation without requiring control from testing unit 110. In one embodiment in accordance with the present invention, testing unit 110 and self-test capacitance circuit 104 communicate using communication lines present in sensor circuit 102.

Referring still to 304 of FIG. 3, although self-test capacitance circuit 104 is shown contained within sensor circuit 102 in FIG. 1, embodiments in accordance with the present invention are also well suited to having external elements temporarily coupled to capacitive touch sensing device 109 function as part of the self-test capacitive circuit.

Referring now to 306, the present method for production testing of a capacitive touch sensing device compares the first value (derived at 302) and the second value (derived at 304) to determine a production testing result for the first channel of the capacitive touch sensing device. Moreover, in embodiments in accordance with the present invention, the comparing of the first value and the second value occur during production of the capacitive touch sensing device. That is, the received production testing result can be compared with an expected result to determine the differences there between. In so doing, the present method for production testing of a capacitive touch sensing device is readily able to identify problems with how individual traces or collections of traces of the sensor electrodes respond to the applied capacitance as a proxy for an externally applied proximity influenced capacitance. As a result, shorts between a single trace and a power supply, ground, or another trace are readily detected by the present method while the capacitive touch sensing device is still in production. This production testing result from the capacitive self-test circuit may also be combined with either or both the first value and the second value compared to another expected value to produce a result to further identify production performance (e.g problems) of the sensor. Hence, the present method for production testing of a capacitive touch sensing device is able to ensure that capacitive touch sensing devices, which do not meet promised specifications and performance requirements, are not released to customers. Therefore, the present method for production testing of capacitive devices is able to detect defects (e.g. shorts from traces to a power supply, a shield, or to other traces, or open traces that fail to correctly couple sensing electrodes) which are not correctable during subsequent operation of the capacitive touch sensing device using conventional compensation techniques. The present method for production testing of a capacitive touch sensing device is also able to detect capacitive gain errors due to guarding, and is able to detect broken traces. The present method is also well suited to using the production testing result to de-convolve or sharpen the response to each of the individual sensor electrodes where the sensor electrodes are coupled together.

In one embodiment in accordance with the present invention, the comparison of the values is made by self-test capacitive circuit 104, and the production testing result is then provided to testing unit 110. In another embodiment in accordance with the present invention, self-test capacitive circuit 104 provides values to testing unit 110 and testing unit 110 then performs the comparison and generates the production testing result. The production testing result may be further compared with an expected (e.g. nominal difference or limiting value) result, in the testing unit 110. This function of comparison to an expected result may be provided outside of the sensor assembly by a production tester used to test multiple manufactured units or within the sensor assembly. An expected result may be communicated to the sensor assembly, or a result may be pre-programmed into the sensor assembly. In some cases (e.g. a cell phone with an LCD display) the manufactured unit itself may indicate whether it's operation is proper or not without communication to separate production equipment used for testing multiple manufactured units.

In another embodiment in accordance with the present method for production testing of a capacitive touch sensing device, after receiving the production testing result, the present method categorizes the capacitive touch sensing device based upon the production testing result for the first channel of the capacitive touch sensing device. That is, embodiments of the present invention can be utilized to bin the capacitive touch sensing devices during production. As a result, different capacitive touch sensing devices can be selected to have operating parameters adjusted (e.g. tuned) in order, for example, to optimize performance. Furthermore, in embodiments in accordance with the present invention, such a selection and "tuning" process can occur during production of the capacitive touch sensing device. It should be understood that in embodiments in accordance with the present invention such computation and correction of the capacitance measurements may take place inside sensor circuit 102, within self-test capacitance circuit 104 or by using an external controller (such as e.g. testing unit 110). Alternately, some capacitive touch sensing devices that do not perform optimally (i.e. within some testing limits) can be selected to be assembled into manufactured units that do not require as stringent limits on performance (e.g. more limited operating temperature range, more controlled environment, more tightly controlled assembly etc.). Hence, embodiments in accordance with the present invention utilize the production testing result to determine whether the capacitive touch sensing device meets a performance requirement. In one embodiment in accordance with the present invention, the production result is used to determine whether or not a capacitive touch sensing device should be categorized to belong in a failure bin.

The production data consisting of the values, testing results and categorizations of multiple sensor assemblies at production can also be used. The logging of the results may aid in improving manufacturing processes and yield. The limiting expected results can be adjusted based on the production data depending on the required performance. Similarly, devices failing after production can be related back to their original production data and/or re-tested to determine appropriate expected results. The production data could be stored on the sensor assembly, in the assembled device, on production equipment, and/or transferred to a variety of other places.

Embodiments in accordance with the present invention are also well suited to sampling on multiple channels of a capacitive touch sensing device. In such an approach, either before, after, or concurrent with the performance of processes described above at 302-306 of FIG. 3, the present method for production testing of a capacitive touch sensing device samples a first value corresponding to a second channel of the capacitive touch sensing device when the capacitive touch sensing device is in production. The present embodiment also samples a second value corresponding to the second channel of the capacitive touch sensing device when the capacitive touch sensing device has a self-test capacitive circuit applying a signal thereto. The signal coupling from the self-test capacitive circuit to the second channel need not be direct (e.g. it could be through another channel's sensor electrode). The present method then compares the first value and the second value to determine a production testing result for the second channel of the capacitive touch sensing device. Such a method is particularly useful for determining whether a first channel is undesirably coupled to a second channel. Additionally, in embodiments in accordance with the present invention, the sampling of the first value and the sampling of the second value occur substantially concurrently. Conversely, in other embodiments in accordance with the present invention, the sampling of the first value and the sampling of the second value occur substantially sequentially with respect to each other. Also embodiments in accordance with the present invention are well suited to sampling the first value when the capacitive touch sensing device does not have a self-test capacitive circuit applying a signal thereto. In one such embodiment, the sampling of the first value occurs when the capacitive touch sensing device has the self-test capacitive circuit applying a second signal different from the first signal.

As described in detail above, based on the production testing result obtained for the second channel, the capacitive touch sensing device can be categorized (e.g. binned). Similarly, the capacitive touch sensing device can be categorized (e.g. binned) based upon the production testing result for the first channel taken in combination with the production testing result for the second channel. Also, the production testing result for the second channel of the capacitive touch sensing device can be used to determine whether the capacitive touch sensing device meets a performance requirement. Embodiments in accordance with the present method for production testing of the capacitive touch sensing device are also well suited to sampling the first channel of the capacitive touch sensing device and the second channel of the capacitive touch sensing device substantially concurrently. Additionally, samples of the first channel of the capacitive touch sensing device and the second channel of the capacitive touch sensing device may be taken simultaneously, but their performance determined independently.

Various embodiments in accordance with the present invention are also well suited to sampling and comparing various other values in addition to or in lieu of the above described first and second values. That is, embodiments in accordance with the present invention are well suited to sampling a third value corresponding to the first channel of the capacitive touch sensing device when the capacitive touch sensing device does not have the self-test capacitive circuit applying a signal thereto. In such an embodiment, and in a manner as is described above in detail, embodiments in accordance with the present invention utilize the third value and the second value to generate a difference value for comparison to a second nominal difference. The third sample value may be used for, but not limited to, determining noise and non-linearity.

Portions of the present technology for production testing of a capacitive touch sensing device are composed of computer-readable and computer-executable instructions that reside, for example, in computer-usable media of a computer system. That is, sensor circuit 102, testing unit 110, and self-test circuit 104 illustrate examples of computer systems and components having computer readable media disposed thereon (e.g. random access memory (RAM) and/or read-only memory (ROM)) that can be used to implement embodiments, which are discussed below, of the present technology for production testing of capacitive touch sensing devices. It is appreciated that the present technology for production testing of capacitive touch sensing devices can operate on or within a number of different computer systems including general purpose networked computer systems, embedded computer systems, routers, switches, server devices, client devices, various intermediate devices/nodes, stand alone computer systems, and the like.

The foregoing descriptions of specific embodiments of the present technology for production testing of a capacitive touch sensing device have been presented for purposes of illustration and description. They are not intended to be exhaustive or to limit the present technology for production testing of a capacitive touch sensing device to the precise forms disclosed, and many modifications and variations are possible in light of the above teaching. The embodiments were chosen and described in order to best explain the principles of the technology for production testing of a capacitive touch sensing device and its practical application, to thereby enable others skilled in the art to best utilize the technology for production testing of a capacitive touch sensing device and various embodiments with various modifications as are suited to the particular use contemplated.

What is claimed is:

1. A method for production testing of a capacitive touch sensing device, said method comprising:
    sampling a first value corresponding to a first channel of said capacitive touch sensing device when said capacitive touch sensing device is in production;
    sampling a second value corresponding to said first channel of said capacitive touch sensing device when said capacitive touch sensing device has a self-test capacitive circuit applying a signal to said capacitive touch sensing device; and
    comparing said first value and said second value to determine a production testing result for said first channel of said capacitive touch sensing device, wherein said sampling said second value and said comparing said first value and said second value occur during production of said capacitive touch sensing device.

2. The method as recited in claim 1 further comprising:
    categorizing said capacitive touch sensing device based upon said production testing result for said first channel of said capacitive touch sensing device.

3. The method as recited in claim 1 further comprising:
    utilizing said production testing result to adjust an operating parameter of said capacitive touch sensing device.

4. The method as recited in claim 3 wherein said utilizing said production testing result to adjust an operating parameter of said capacitive touch sensing device comprises utilizing said production testing result to adjust said operating parameter of said capacitive touch sensing device when said capacitive touch sensing device is in production.

5. The method as recited in claim 1 further comprising:
    utilizing said production testing result to determine whether said capacitive touch sensing device meets a performance requirement.

6. The method as recited in claim 1 further comprising:
    sampling a third value corresponding to a second channel of said capacitive touch sensing device when said capacitive touch sensing device is in production;
    sampling a fourth value corresponding to said second channel of said capacitive touch sensing device when said capacitive touch sensing device has said self-test capacitive circuit applying a signal thereto; and
    comparing said third value and said fourth value to determine a production testing result for said second channel of said capacitive touch sensing device.

7. The method as recited in claim 6 further comprising:
    categorizing said capacitive touch sensing device based upon said production testing result for said first channel of said capacitive touch sensing device and said production testing result for said second channel of said capacitive touch sensing device.

8. The method as recited in claim 6 further comprising:
    utilizing said production testing result for said first channel of said capacitive touch sensing device and said production testing result for said second channel of said capacitive touch sensing device to determine whether said capacitive touch sensing device meets a performance requirement.

9. The method as recited in claim 6 wherein said first channel of said capacitive touch sensing device and said second channel of said capacitive touch sensing device are sampled substantially sequentially.

10. The method as recited in claim 6 wherein said first channel of said capacitive touch sensing device and said second channel of said capacitive touch sensing device are sampled substantially concurrently.

11. The method as recited in claim 1 wherein said sampling a first value corresponding to a first channel of said capacitive touch sensing device when said capacitive touch sensing device is in production comprises:
    sampling said first value when said capacitive touch sensing device does not have said self-test capacitive circuit applying said signal thereto.

12. The method as recited in claim 11 wherein said sampling said first value when said capacitive touch sensing device does not have said self-test capacitive circuit applying said signal thereto comprises:
    sampling said first value when said capacitive touch sensing device has said self-test capacitive circuit applying a second signal different from said signal thereto.

13. The method as recited in claim 1 wherein said comparing said first value and said second value comprises:
    relating a difference between said first value and said second value to a nominal difference.

14. The method as recited in claim 1 further comprising:
    sampling a third value corresponding to said first channel of said capacitive touch sensing device when said capacitive touch sensing device does not have said self-test capacitive circuit applying said signal thereto.

15. The method as recited in claim 14 further comprising:
    utilizing said third value and said second value to generate a difference value for comparison to a second nominal difference.

16. A production testing system for a capacitive touch sensing device, said production testing system comprising:
    a self-test capacitive circuit configured to sample a plurality of values corresponding to a first channel of a capacitive touch sensing device when said capacitive touch sensing device is in production; and
    a testing unit coupled to said self-test capacitive circuit, said testing unit configured to function cooperatively with said self-test capacitive circuit to generate a production testing result for said first channel of said capacitive touch sensing device, said testing unit further configured to compare a first value and a second value of said plurality of values to determine and generate said production testing result for said first channel of said capacitive touch sensing device.

17. The production testing system of claim 16 wherein said self-test capacitive circuit is configured to sample a plurality of values corresponding to a plurality of channels of said capacitive touch sensing device when said capacitive touch sensing device is in production.

18. The production testing system of claim 17 wherein said testing unit is configured to function cooperatively with said self-test capacitive circuit to generate a production testing result for each of said plurality of channels of said capacitive touch sensing device.

19. The production testing system of claim 17 wherein said self-test capacitive circuit is configured to sample a plurality of values corresponding to a plurality of channels of said capacitive touch sensing device substantially sequentially when said capacitive touch sensing device is in production.

20. A non-transitory computer-readable storage medium having computer readable code embodied thereon for causing a computer to perform a method for production testing of a capacitive touch sensing device, said method comprising:
receiving a first sampled value corresponding to a first channel of said capacitive touch sensing device when said capacitive touch sensing device is in production;
receiving a second sampled value corresponding to said first channel of said capacitive touch sensing device when said capacitive touch sensing device has a self-test capacitive circuit applying a signal thereto; and
determining a production testing result for said first channel of said capacitive touch sensing device by comparing said first sampled value and said second sampled value.

21. The non-transitory computer-readable storage medium as recited in claim 20 having computer readable code embodied thereon for causing said computer to:
categorize said capacitive touch sensing device based upon said production testing result for said first channel of said capacitive touch sensing device.

22. The non-transitory computer-readable storage medium as recited in claim 20 having computer readable code embodied thereon for causing said computer to:
utilize said production testing result to adjust an operating parameter of said capacitive touch sensing device.

23. The non-transitory computer-readable storage medium as recited in claim 20 having computer readable code embodied thereon for causing said computer to:
sample a first value corresponding to a second channel of said capacitive touch sensing device when said capacitive touch sensing device is in production;
sample a second value corresponding to said second channel of said capacitive touch sensing device when said capacitive touch sensing device has said self-test capacitive circuit applying a signal thereto; and
compare said first value and said second value to determine a production testing result for said second channel of said capacitive touch sensing device.

24. The non-transitory computer-readable storage medium as recited in claim 23 having computer readable code embodied thereon for causing said computer to:
categorize said capacitive touch sensing device based upon said production testing result for said first channel of said capacitive touch sensing device and said production testing result for said second channel of said capacitive touch sensing device.

25. The non-transitory computer-readable storage medium as recited in claim 23 having computer readable code embodied thereon for causing said computer to:
utilize said production testing result for said first channel of said capacitive touch sensing device and said production testing result for said second channel of said capacitive touch sensing device to determine whether said capacitive touch sensing device meets a performance requirement.

* * * * *